US 8,847,312 B2

(12) United States Patent
Yang et al.

(10) Patent No.: US 8,847,312 B2
(45) Date of Patent: Sep. 30, 2014

(54) LDMOS DEVICE AND METHOD FOR IMPROVED SOA

(75) Inventors: Hongning Yang, Chandler, AZ (US); Zhihong Zhang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 168 days.

(21) Appl. No.: 13/561,959

(22) Filed: Jul. 30, 2012

(65) Prior Publication Data

US 2014/0027849 A1   Jan. 30, 2014

(51) Int. Cl.
*H01L 29/78* (2006.01)

(52) U.S. Cl.
CPC ..................................... *H01L 29/78* (2013.01)
USPC .................... 257/343; 438/283; 257/E29.261; 257/E21.409

(58) Field of Classification Search
CPC .............. H01L 29/402; H01L 29/0847; H01L 29/1045; H01L 29/66659; H01L 29/7835; H01L 29/78; H01L 29/66681
USPC .................... 257/E21.409, E29.261, E29.242, 257/E29.255, 343, 350; 438/283
See application file for complete search history.

(56) References Cited

U.S. PATENT DOCUMENTS

| | | | |
|---|---|---|---|
| 7,608,513 B2 * | 10/2009 | Yang et al. | 438/286 |
| 7,795,674 B2 * | 9/2010 | Yang et al. | 257/336 |
| 7,795,681 B2 * | 9/2010 | Williams et al. | 257/349 |
| 8,748,271 B2 * | 6/2014 | Toh et al. | 438/283 |
| 2007/0284360 A1 * | 12/2007 | Santoruvo et al. | 219/439 |
| 2013/0020632 A1 * | 1/2013 | Disney | 257/328 |
| 2013/0105888 A1 * | 5/2013 | Zuniga et al. | 257/330 |
| 2013/0344671 A1 * | 12/2013 | Kim | 438/286 |
| 2014/0027849 A1 * | 1/2014 | Yang et al. | 257/343 |

OTHER PUBLICATIONS

P. Hower, J. Lin, S. Pendharkar, B. Hu, J. Arch, J. Smith, T. Efland, "A Rugged LDMOS for LBC5 Technology", ISPSD 2005, p. 159, 2005.
Tahir Khan, Vishnu Khemka, Ronghua Zhu and Abe Bose, "Rugged Dotted-channel LDMOS structure", IEDM 2008.

* cited by examiner

*Primary Examiner* — Stephen W Smoot
*Assistant Examiner* — Edward Chin
(74) *Attorney, Agent, or Firm* — Ingrassia Fisher & Lorenz, P.C.

(57) ABSTRACT

A lateral-diffused-metal-oxide-semiconductor device having improved safe-operating-area is provided. The LDMOS device includes spaced-apart source and drain, separated by a first insulated gate structure, and spaced-apart source and body contact The spaced-apart source and BC are part of the emitter-base circuit of a parasitic bipolar transistor that can turn on prematurely, thereby degrading the SOA of prior art four-terminal LDMOS devices. Rather than separating the source and BC with a shallow-trench-isolation region as in the prior art, the semiconductor surface in the gap between the spaced-apart source and BC has there-over a second insulated gate structure, with its gate conductor electrically tied to the BC. When biased, the second insulated gate structure couples the source and BC lowering the parasitic resistance in the emitter-base circuit, thereby delaying turn-on of the parasitic transistor and improving the SOA of such 4-T LDMOS devices.

20 Claims, 6 Drawing Sheets

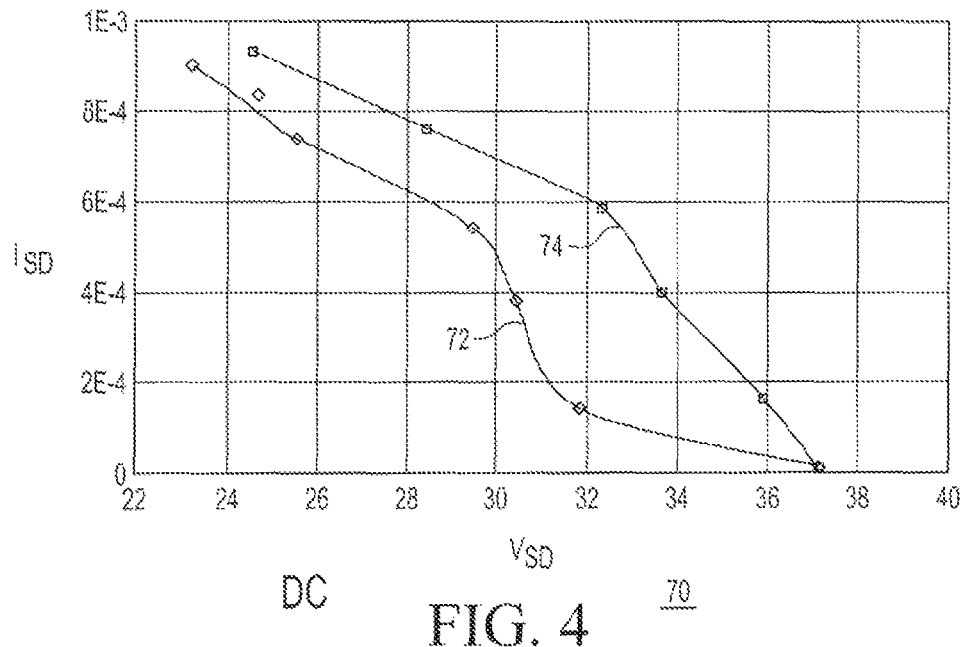
DC  FIG. 4  70
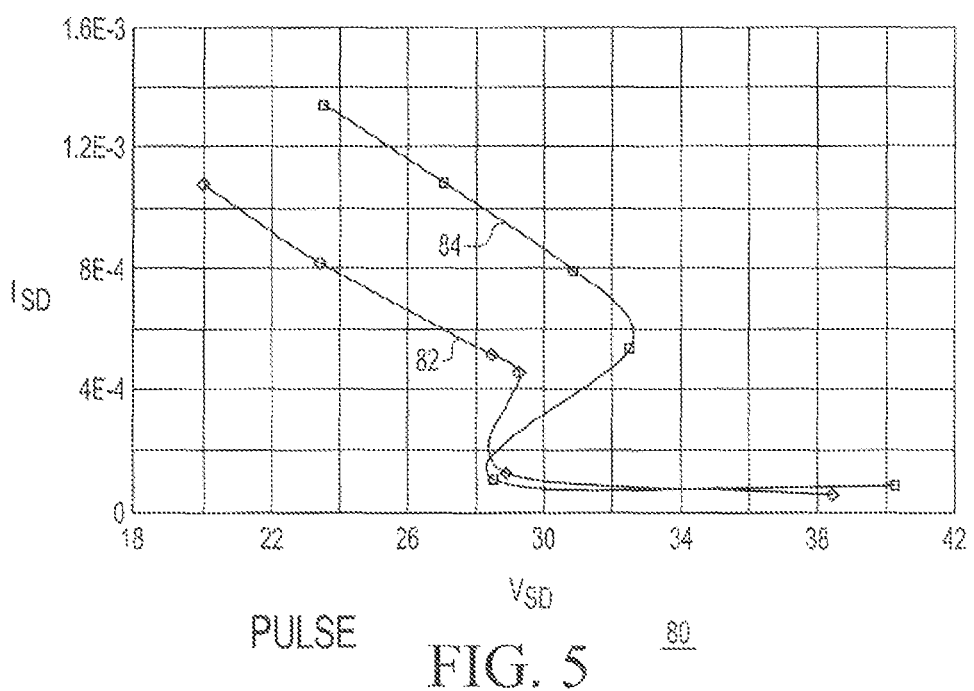
PULSE  FIG. 5  80

LDMOS DEVICE AND METHOD FOR IMPROVED SOA

FIELD OF THE INVENTION

The present invention generally relates to semiconductor devices and methods for fabricating such devices and circuits using them, and more particularly, devices and methods embodying Lateral Diffused Metal-Oxide Semiconductor (LDMOS) devices.

BACKGROUND OF THE INVENTION

Lateral Diffused Metal-Oxide Semiconductor (LDMOS) devices are much used in power electronics, either as individual devices or as portions of integrated circuits (ICs) embodying these and other devices or elements. An important property of such LDMOS devices and circuits is what is referred to as the Safe Operating Area (SOA). The SOA is generally the range of terminal voltage and current conditions under which the device can be safely operated without self-damage.

BRIEF DESCRIPTION OF THE DRAWINGS

The present invention will hereinafter be described in conjunction with the following drawing figures, wherein like numerals denote like elements, and wherein:

FIGS. 4-5 shows simplified plots of source-drain (SD) current verses SD voltage illustrating the SOA boundaries of LDMOS devices of the sort illustrated in FIG. 1 according to the prior art, and of the sort illustrated in FIG. 3 according to an embodiment of the invention, under DC conditions (FIG. 4) and pulse conditions (FIG. 5)

DETAILED DESCRIPTION OF THE INVENTION

Figure 1:
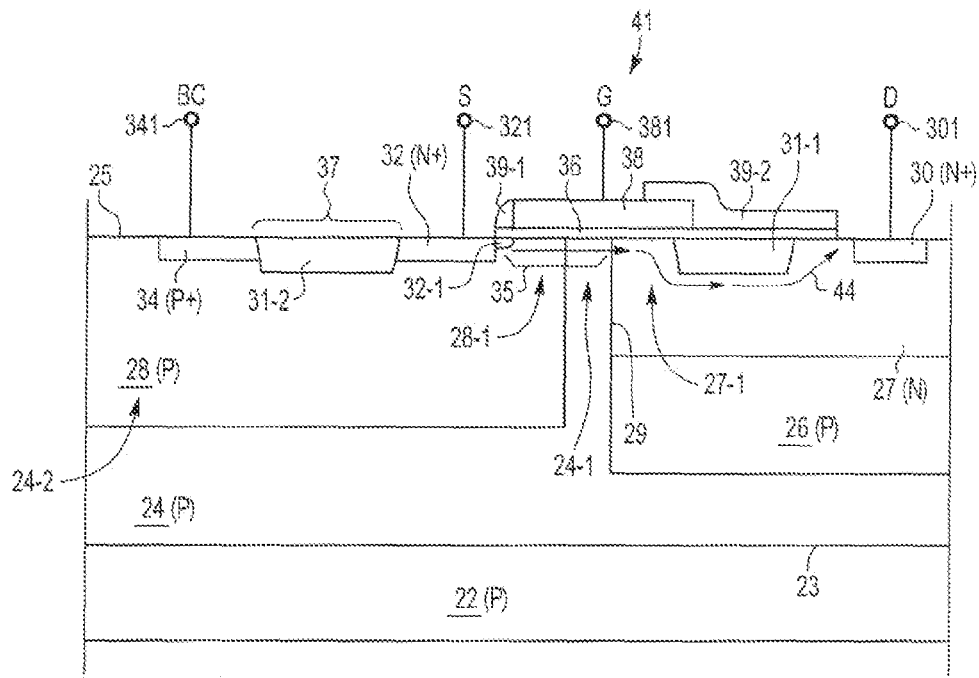
FIG. 1 shows a simplified cross-sectional view of a four terminal lateral-diffused-metal-oxide-semiconductor (LDMOS) device according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

The term metal-oxide-semiconductor (MOS) is widely used in the art to refer to any structure that employs any type of conductor (e.g., represented by the "M") and not just metallic elements, wherein such conductor overlies a semiconductor (SC) containing substrate (e.g., represented by the "S"), and the M-S sandwich has any type of inorganic or organic dielectric (e.g., represented by the "O") in between that is not limited merely to oxides. Similarly, a MOS field effect transistor (FET), singular or plural, is commonly referred to by the abbreviation "MOSFET", and is also intended to have this broader meaning. Thus, as used herein the abbreviations MOS and MOSFET and the terms for which they stand are not limited merely to metallic conductors and oxide insulators but may use any form of conductive material for gate conductors and form of insulating dielectric for gate insulators and any form of semiconductor and semiconductor substrate including those described below.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate", "semiconductor substrate" and "SC substrate" are intended to include single crystal structures, polycrystalline structures, amorphous structures, thin film structures and layered structures. Non-limiting examples of layered structures include semiconductor-on-insulator (SOI) structures, insulator on semiconductor (IOS) structures and combinations thereof.

For convenience of explanation and not intended to be limiting, semiconductor devices and methods of fabrication are described herein for silicon semiconductors, but persons of skill in the art will understand that other semiconductor materials may also be used. Additionally, various device types, conductivity types and/or doped SC regions may be identified as being of N type or P type depending on the nature of their majority carriers, but this is merely for convenience of description and not intended to be limiting. Accordingly, such identification may be replaced by the more general description of being of a "first conductivity type" or of a "second, opposite conductivity type" where the first type may be either N or P type and the second type is then either P or N type.

Various embodiments of the invention will be illustrated for N-channel LDMOS devices, but, again, this is merely for convenience of description and is not intended to be limiting. Persons of skill in the art will understand that P-channel LDMOS and other semiconductor devices and circuits embodying either or both N and P or P and N combinations may be provided by appropriate interchange of conductivity types in the various regions. For convenience of description, the convention is adopted in the various drawings of identifying the exemplary (e.g., N-channel) configuration by placing the corresponding conductivity type in parentheses following the associated reference number. For example, in FIGS. 1-3, body contacts 34 are identified as 34(P+), source regions 32 are identified as 32(N+), SC layers or well regions 24, 26, 27, 28 are identified as 24(P), 26(P), 27(N); 28(P), etc., merely to illustrate the exemplary conductivity types for an N-channel embodiment. It will be understood that this is by way of example and not limitation and applies to both unprimed and primed (') reference numbers.

SOA information for an LDMOS device is usually presented as a graph of the source-drain (SD) current versus the SD voltage applied to the device. The SOA is customarily defined as the area beneath a SD current-voltage boundary line (the SOA boundary) illustrating the upper limits of SD voltages and SD currents, at or below which the device can be safely operated without self-damage or misbehavior. The SOA boundary line on the SD current versus voltage chart generally runs from upper left to lower right, that is, from higher currents at lower voltages to lower currents at higher voltages. Any combination of SD currents and SD voltages that fall below the SOA boundary line are said to be within the SOA. Different SOA characteristics may be defined for analog (e.g., continuous or DC) operation and for pulsed operation, depending on the intended device use.

The SOA is an important device parameter. The larger the SOA the more versatile the device. It can be operating under a greater range of current-voltage conditions without self-damage or substantial misbehavior. Thus, having improved SOA is much desired, especially in power electronic applications where comparatively high currents and/or high voltages are often encountered. Accordingly, there is an ongoing need to provide LDMOS and other electronic devices having improved SOA and for methods of fabricating such improved devices individually or as part of an IC.

FIG. 1 shows a simplified cross-sectional view of lateral-diffused-metal-oxide-semiconductor (LDMOS) device 20 according to the prior art. LDMOS device 20 comprises semiconductor (SC) substrate 22 (e.g., P type) having upper surface 23. Overlying upper substrate surface 23 is (e.g., P type) epi) semiconductor (SC) layer 24 having upper surface 25. SC layer 24 includes, toward the right, buried (e.g., P type) well region 26 and overlying (e.g., N type) well region 27 extending to surface 25. Toward the left, SC layer 24 may include (e.g., P type) well region 28 extending to upper surface 25. Reference number 24-2 identifies that part of SC region 24 occupied by well region 28. Channel portion 24-1 of SC layer 24 lies laterally between the combination of well regions 26, 27 and well region 28. NP (or PN) junction 29 lies between well region 27 and channel portion 24-1 of SC layer 24. This structure is conventional.

Lying laterally within well region 27 is shallow trench isolation (STI) region 31-1 and lying laterally within well region 28 is STI region 31-2, both extending substantially to surface 25. Drain (e.g., N+) contact 30 lies within well region 27 proximate surface 25 to the right of STI region 31-1. Drain terminal 301 is in Ohmic contact with drain contact 30. Source (e.g., N+) region 32 lies within well region 28 proximate surface 25 and to the right of STI region 31-2. Source contact 321 is in Ohmic contact with source region 32. Portion 28-1 of well region 28 lies between source region 32 and channel portion 24-1 of SC region 24. Channel region 35 of device 20 comprises the combination of portions 28-1 and 24-1 of well region 28 and SC region 24 lying between source region 32 and (PN or NP) junction 29. Reference number 35 as used herein should be understood to represent the channel region between source region 32 and (PN or NP) junction 29 of drain well region 27, whether composed entirely of portions 28-1 of well region 28 (e.g., where portion 24-1 of SC region 24 is omitted) or of portion 24-1 (e.g., where well region 28 is omitted) or a combination thereof, as is explained in more detail later. Body contact (e.g., P+) region 34 lies in well region 28 proximate surface 25 to the left of STI region 31-2. Gap 37 (or gap portion 37 of surface 25) identifies the lateral separation of source 32 and body contact 34. In the example of FIG. 1, STI region 31-2 occupies or underlays gap 37. Body Contact connection (BC) 341 is Ohmically connected to body contact region 34.

Gate conductor 38 overlies surface 25 and typically extends laterally leftward from STI region 31-1 over drift portion 27-1 of well region 27, laterally across channel portion 24-1 of SC layer 24 and laterally across channel portion 28-1 of well region 28 (collectively channel region 35) substantially to source region 32. Gate conductor 38 is separated from surface 25 of well regions 27, 28 and portion 24-1 of SC region 24 by gate insulator 36. Gate (G) connection 381 is Ohmically connected to gate conductor 38. It is customary to provide dielectric regions 39-1 at the leftward edge of gate conductor 38 and dielectric region 39-2 at the rightward edge of gate conductor 38, but they may be omitted. Source region 32 may have (e.g., N type) extension 32-1 underlying lateral dielectric region 39-1 to about the left edge of gate conductor 38. Well region 27 may also be referred to as drain region 27, having drain contact 30 therein. When drain contact 30, gate conductor 38, source region 32 and body contact 34 are appropriately biased, source-drain (SD) current 44 flows laterally from source region 32 (and extension 32-1), through channel portions 28-1 and 24-1 of body (well or SC) regions 28, 24 (collectively channel region 35), across (PN or NP) junction 29 into drift portion 27-1 of drain (e.g., well) region 27 and then underneath STI region 31-1 to drain contact 30. The combination of gate insulator 36, gate conductor 38 gate connection 381 and optional gate dielectric regions 39-1, 39-2 are referred to collectively as gate structure 41. Prior art LDMOS device 20 is conventional.

Device 20 of FIG. 1 is a 4-terminal (4-T) LDMOS device. Body contact (BC) region 34 has terminal connection 341 separate from terminal connection 321 of source region 32. This permits body region 28 (and 24, 24-1), and source region 32 to be separately biased, which is desirable under some circumstances. However it has been found that the SOA of prior art 4-T LDMOS devices, including device 20 illustrated in FIG. 1, is substantially poorer than the SOA of otherwise equivalent 3-T LDMOS devices, e.g., devices where the source region and the body contact region are typically adjacent and shorted together. This is a significant disadvantage of prior art 4-T LDMOS devices and can greatly limit their usefulness.

Figure 2:
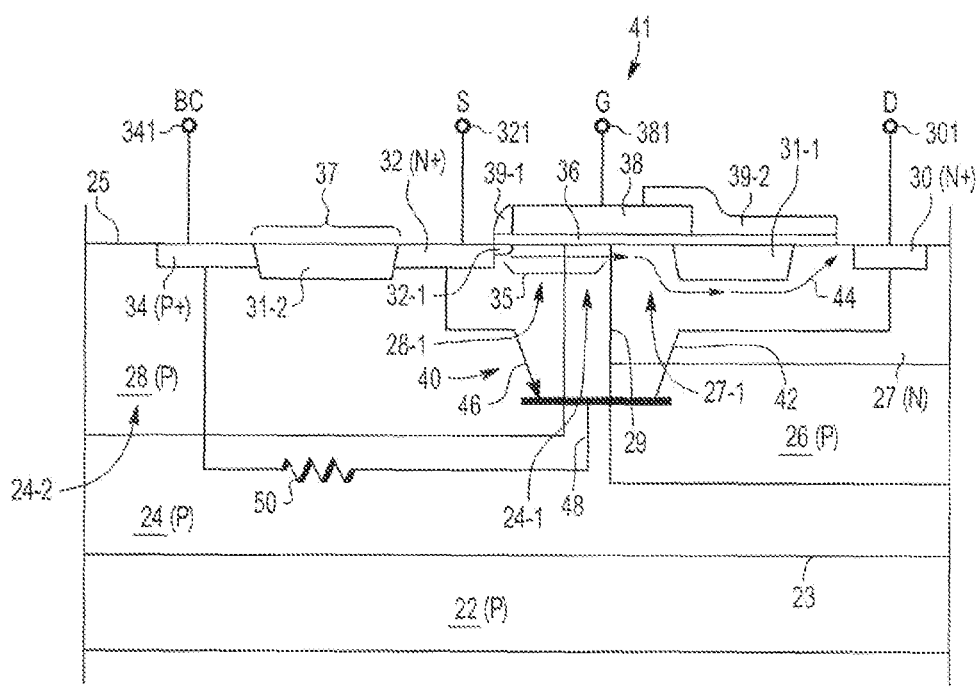
FIG. 2 shows the device of FIG. 1 with a representation of a parasitic bipolar transistor overlaid thereon, illustrating how the configuration of the device of FIG. 1 can give rise to undesired behavior and even damage, thus limiting the attainable SOA.

FIG. 2 shows LDMOS device 20 of FIG. 1 with a representation of parasitic bipolar transistor 40 overlaid thereon, illustrating how the configuration of prior art device 20 of FIG. 1 can give rise to misbehavior, thus limiting the attainable SOA. Collector region 42 of parasitic (e.g., NPN) bipolar transistor 40 is formed by (e.g., N+) drain contact 30 and (e.g., N type) drain well region 27. Collector 42 is coupled to terminal connection 301. Emitter 46 of parasitic (e.g., NPN) bipolar transistor 40 is formed by (e.g., N+) source region 32. Emitter 46 is coupled to terminal connection 321. Base 48 of parasitic (e.g., NPN) transistor 40 is formed by the combination of (e.g., P type) well regions 28, 26 and SC layer 24, which are all of the same conductivity type and all Ohmically coupled by body contact 34 to terminal connection 341. Because of the lateral separation of (e.g., P type) body contact (BC) 34 to base 48 of parasitic bipolar transistor 40, and (e.g., N+ source) region 32 acting as emitter 46 of parasitic bipolar transistor 40, parasitic resistance 50 exists in the emitter-base circuit of parasitic bipolar transistor 40. During LDMOS operation in which the drain is biased, especially at higher voltages, the device regions near the corners of drain region 27, 30, drift region 27-1, and STI region 31-1 are often locations of high electric field. Where exposed to high electric fields, the mobile carriers (e.g., electrons or holes) will be accelerated to high kinetic energy, thereby becoming what are referred to as "hot carriers". These hot carriers impact the background semiconductor lattice, thereby causing impact ionization. This effect is referred to in the art as "hot carrier ionization" (HCI) and can generate a large number of electron-hole pairs. The electrons generated from HCI will be collected by the drain 27, 30 and drain terminal 301, and the holes generated from HCI will flow to BC 34 and BC terminal 341. The hole current flowing through "base" (i.e., body) BC terminal 341 and "emitter" (i.e., source) terminal 321 via parasitic resistance 50 leads to increased emitter-base bias within parasitic bipolar transistor 40, eventually causing it to turn on. When that happens, device 20 misbehaves, that is, ceases to function as a conventional LDMOS device. Such misbehavior can cause the circuit of which device 20 is a part to cease functioning properly temporarily or permanently. Thus, the configuration of prior art 4-T LDMOS device 20 of FIG. 1 generally has a significantly lower SOA than an otherwise equivalent 3-T LDMOS device. It has been found that the SOA and usefulness of 4-T LDMOS devices can be substantially increased by overcoming this problem. This is very desirable.

Figure 3:
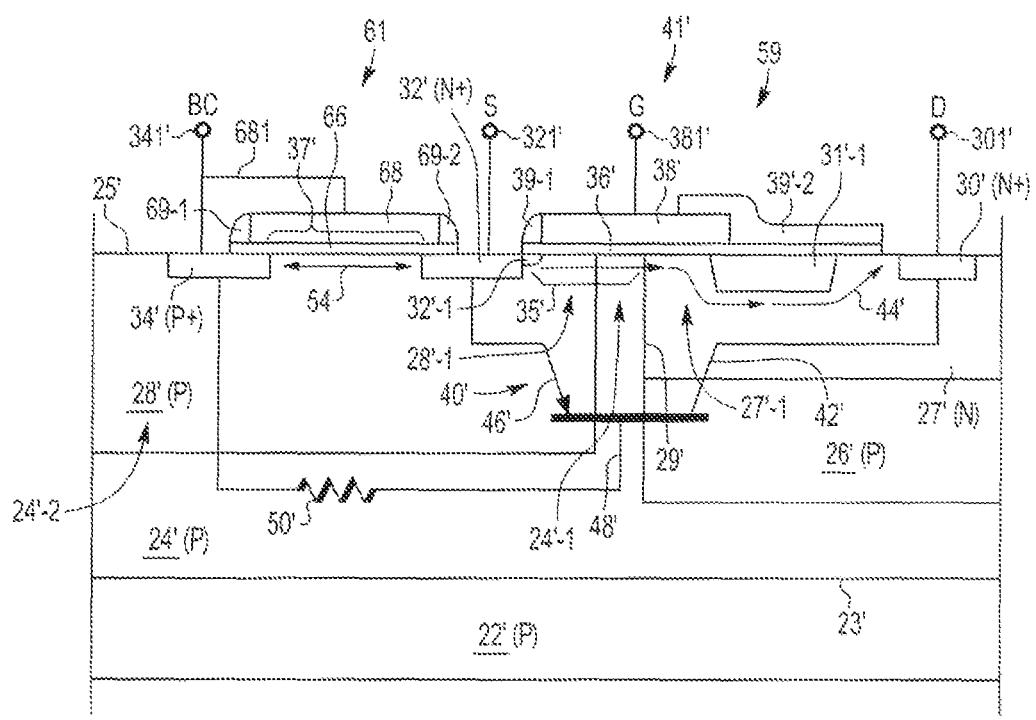
FIG. 3 shows a simplified cross-sectional view of a four terminal LDMOS device according to an embodiment of the invention, wherein the failure mode of the LDMOS device of FIG. 1 related to the parasitic bipolar transistor is avoided or ameliorated, thereby providing improved SOA.

FIG. 3 shows a simplified cross-sectional view of 4 terminal LDMOS device 60 according to an embodiment of the invention, wherein the low SOA performance tendency of prior art 4-T LDMOS device 20 of FIG. 1 is avoided or ameliorated. For convenience of explanation, parasitic transistor 40' analogous to parasitic transistor 40 of FIG. 2 is included in FIG. 3 and the structure of device 60 of FIG. 3 is illustrated as being similar to that of device 20 of FIGS. 1-2 but with addition of further gate structure 61. For economy of description the convention is followed of using the same reference numbers but with a prime (') attached for objects, elements or regions within FIG. 3 that are functionally analogous to those of the same reference number but without a prime (') in FIGS. 1-2. For example, objects, elements or regions having reference numbers 22', 24', 26', 27', 28', ... 36', 38', 39', 40', 41', 44', etc., of FIG. 3 are generally functionally analogous to objects, elements or regions having corresponding reference numbers 22, 24, 26, 27, 28, ... 36, 38, 39, 40, 41, 44, etc., of FIGS. 1 and/or 2. Hence, the descriptions accompanying the original reference numbers provided in FIGS. 1-2, are intended to apply generally to the same, but primed ('), reference numbered objects, elements or regions in FIG. 3. To save unnecessary repetition, the descriptions in connection with FIGS. 1-2 of such objects, elements or regions sharing the same reference numbers with those of FIG. 3 (but with a prime (') added in FIG. 3) are incorporated herein by reference. This is not intended to imply that such objects, elements or regions with common reference numbers with and without primes ('), are identical in LDMOS devices 60 and 20, but merely to acknowledge their analogous functions and avoid unnecessary repetition. The further convention is followed in connection with FIG. 3 of omitting primes (') from reference numbers of objects, elements or regions that have no counterpart in FIGS. 1-2. By way of example and not limitation, reference numbers of the various elements of gate structures 41, 41' found in both devices 20 and 60 are primed in connection with device 60, but the reference numbers of elements of further gate structure 61 of FIG. 3 that have no counterpart in device 20 are free from such primes ('). This convention is followed throughout.

As noted above, LDMOS device 60 of FIG. 3 differs from LDMOS device 20 of FIGS. 1-2 by the addition of further gate structure 61. This is in addition to gate structure 41, 41' illustrated in both LDMOS devices 20 and 60. Stated another way, semiconductor device 60 comprises conventional 4-terminal LDMOS device 59 (i.e., without gate structure 61) plus gate structure 61 overlying surface 25' of SC well or region 28', 24' substantially bridging gap 37' between source region 32' and body contact region 34'. STI region 31-2 of FIGS. 1-2 is omitted in device 60 of FIG. 3. Persons of skill in the art will understand that gate structure 61 overlies surface 25' of well region 28' when well region 28' is included or overlies surface 25' of SC region 24' when well region 28' is omitted. Gate structure 61 overlies gap 37' between source region 32' and body contact region 34' where STI region 31-2 of prior art device 20 was located in FIGS. 1-2, which STI region is omitted in device 60 of FIG. 3. Further gate structure 61 comprises gate conductor 68 overlying gap 37' between (e.g., N+) source region 32' and (e.g., P+) body contact region 34'. Gap 37' between the source region 32' and the body contact region 34' is desirably at least about 0.1 micrometers wide. Gate conductor 68 is vertically separated from surface 25' by insulating layer 66, analogous in function to insulating layer 36' of gate structure 41'. Gate structure 61 may laterally overlap (e.g., N+) source region 32' and (e.g., P+) body contact region 34', but such overlap may be omitted in other embodiments. Gate conductor 68 of further gate structure 61 has terminal connection 681 that is electrically coupled to BC terminal 341' of BC region 34' (and thus to BC region 34') so that the electrical potentials of gate conductor 68 and BC region 34' are substantially similar. For convenience of description, gate structure 41' may also be referred to as "first gate structure" or "first gate structure 41" and further gate structure 61 may also be referred to as "second gate structure" or "second gate structure 61".

LDMOS device 60 is a four-terminal (4-T) LDMOS device with analogous terminal connections, e.g., drain terminal 301', gate terminal 381', source terminal 321' and BC terminal 341' as were present in prior art LDMOS device 20. However, because of the inclusion of further gate structure 61, the electrical properties and particularly the SOA of 4-T LDMOS device 60 of FIG. 3 are generally better than those of prior art 4-T LDMOS device 20 of FIGS. 1-2. In particular, the SOA of 4-T device 60 of FIG. 3 is significantly improved compared to the SOA of 4-T device 20 of FIGS. 1-2. This is illustrated in more detail in connection with FIGS. 4-5.

As operating voltages are applied to terminals 301', 381', 321', 341' of device 60, for example, having the same magnitude and polarity as were applied to the corresponding terminals of prior art device 20, channel region 54 underlying gap 37' beneath further gate structure 61 of device 60 becomes more conductive. This has the effect of reducing the apparent size of parasitic resistance 50' in the emitter-base circuit of parasitic transistor 40' of FIG. 3. The lower the apparent value of parasitic resistance 50', the higher the current and/or voltage that can be applied to device 60 before parasitic bipolar transistor 40' turns ON. This increases the SOA of device 60 relative to prior art device 20.

FIGS. 4 and 5 shows simplified plots 70, 80 of source-drain (SD) current verses SD voltage illustrating SOA boundaries 72, 82 of LDMOS device 20 of FIG. 1 according to the prior art, compared to SOA boundaries 74, 84 of LDMOS device 60 of FIG. 3 according to embodiments of the invention. Plot 70 of FIG. 4 shows DC results and plot 80 of FIG. 5 shows pulse test results with a pulse width of 100 nano-seconds. Except for the presence of second gate structure 61 in device 60 in place of STI region 31-2 of device 20, these LDMOS devices were otherwise similar, with substantially the same doping, materials and dimensions. The vertical axis of plots 70 and 80 show equivalently determined SD currents and the horizontal axis of plots 70 and 80 show equivalently determined SD voltages. Gate conductor 68 of gate structure 61 is coupled to BC terminal 341' and BC region 34'. It will be noted that, except for the very low current, high voltage pulse-test region in FIG. 5, SOA boundaries 74, 84 of LDMOS device 60 of FIG. 3 have generally higher SD voltages and/or higher SD currents than SOA boundaries 72, 82 of prior art LDMOS 20 of FIG. 1. This is a highly desirable result.

While LDMOS device 60 is shown as having the same general LDMOS configuration as LDMOS device 20, this is merely for convenience of explanation and not limitation. Improvement in SOA analogous to those illustrated herein can be obtained even though LDMOS device 60 is formed with somewhat different configurations. For example, in another embodiment, well region 28' may be omitted so that the body region of such LDMOS device is formed merely by upward extending part 24'-2 of SC region 24' to the left of (PN or NP) junction 29'. In that situation, source region 32' is separated from junction 29' by channel region 35' composed entirely of part of SC region 24'. Reference number 24'-2 identifies that upward extending part of SC region 24' that might otherwise be occupied by well region 28'. In a still further embodiment, body region 28' may be included but extend laterally to (PN or NP) junction 29', i.e., when portion 24-1' of SC region 24' laterally between well region 28' and (PN or NP) junction 29' shown in FIG. 3 is not present and channel region 35' is composed entirely of part of well region 28'. Accordingly, as used herein, reference number 35' is intended to refer to the channel region between source 32' and (PN or NP) junction 29', whether composed merely of parts of well region 28' or of SC region 24', or of a combination thereof. In another embodiment, (e.g., P type) buried region 26' may be omitted. In yet another embodiment, substrate 22' and SC region 24' may be combined or, alternatively, an insulating layer (not shown) may be provided between substrate 22' and SC region 24'. Any of these variations or combination of these variations is useful, all with SC gap 37' between body contact region 34' and source region 32' overlain by further gate structure 61 above surface 25' of (e.g., P-type) SC well or region 28', 24' to provide 4-T LDMOS device 60 having improved SOA.

It should be noted that for comparable device dimensions, in some embodiments, LDMOS device 60 of FIG. 3 can be built in substantially the same die area as device 20 of FIG. 1, since the die area occupied by further gate structure 61 in device 60 is not being added but was formerly occupied by second STI region 31-2 in prior art device 20 of FIG. 1, which STI region is omitted in LDMOS device 60 of FIG. 3. Further, device 60 can be manufactured on the same manufacturing line as device 20, so no additional facilities cost is involved in obtaining the SOA improvement. Still further, in some embodiments, no additional process steps are needed since further or second gate structure 61 can be formed at the same time and during the same processing steps as first gate structure 41, using conventional manufacturing techniques. This has the overall advantage that the SOA improvements illustrated in FIGS. 4-5 may be obtained without any increase in manufacturing cost. However, additional process steps are not precluded in other embodiments.

Figure 6:
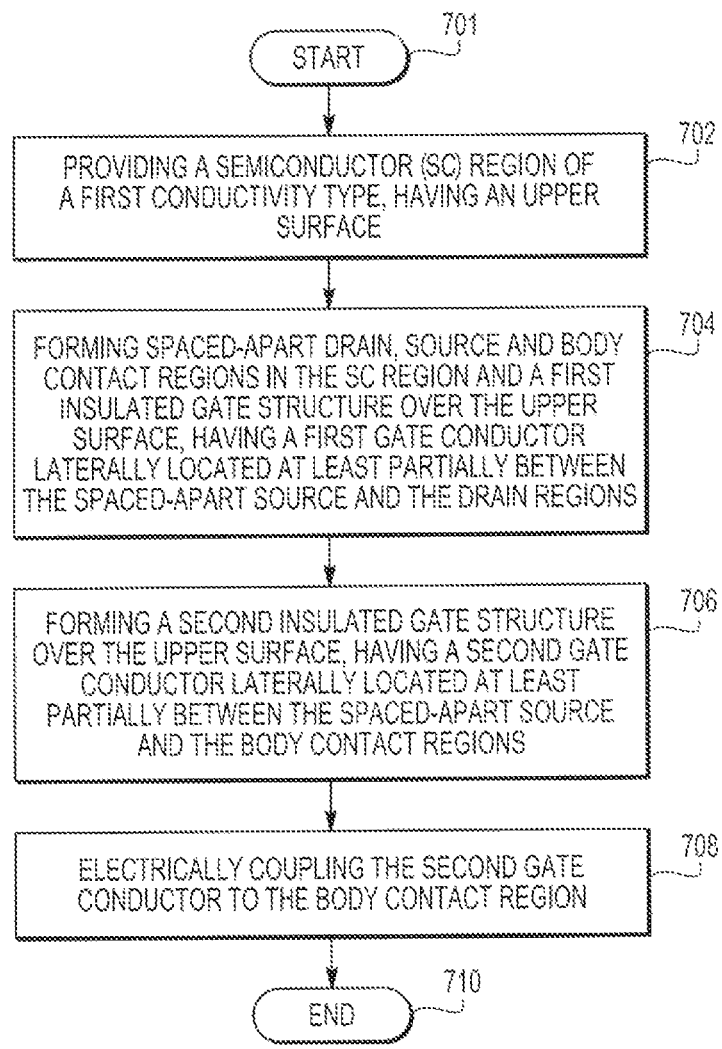
FIGS. 6-8 present simplified flow charts of a method of manufacturing of an LDMOS device of the type illustrated in FIG. 3, according to still further embodiments of the invention.
Figure 7:
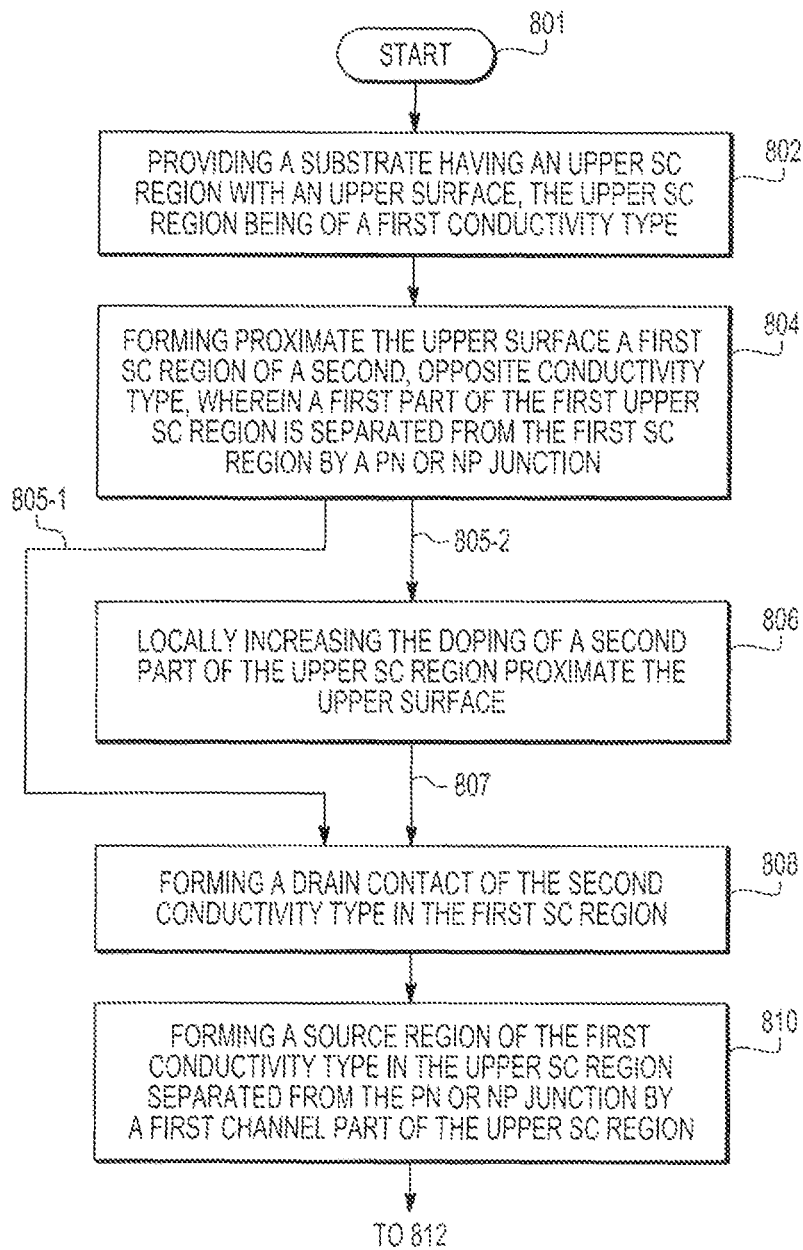
Figure 8:
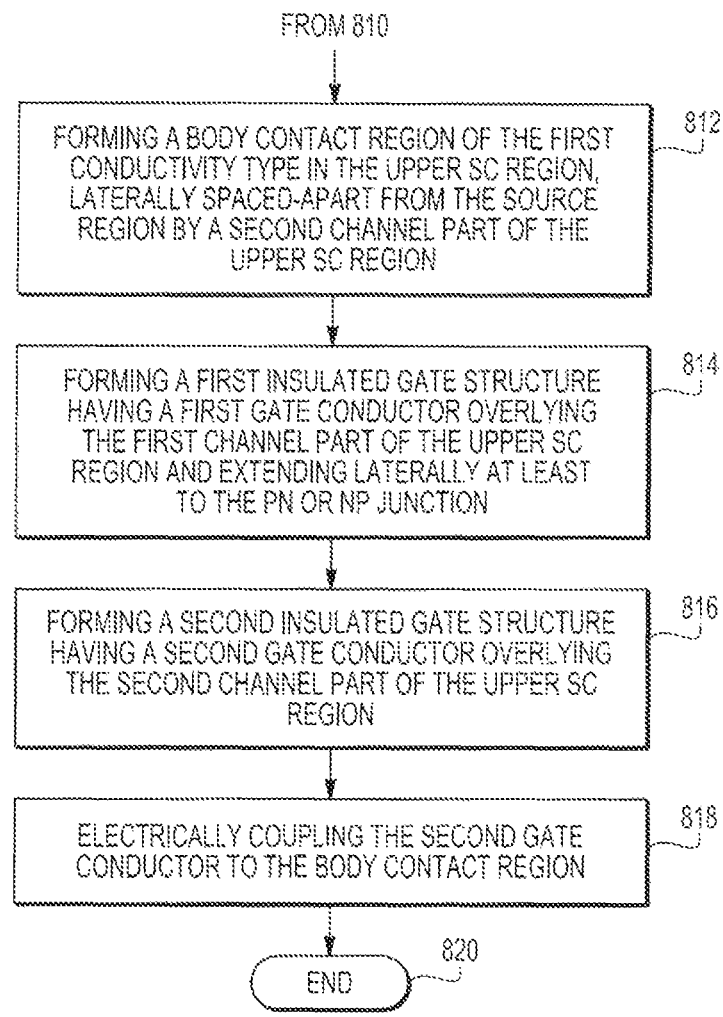

FIGS. 6-8 present simplified flow charts of method of manufacture 700, 800 of LDMOS device 60 of FIG. 3, according to still further embodiments of the invention. Method 700 of FIG. 6 begins with START 701 and initial step 702 wherein there is provided a SC region (24', 28') of a first conductivity type having an upper surface (25'). In step 704, spaced apart drain (27', 30'), source (32') and body contact (BC) (34') regions are formed in the SC region (28', 24') and a first insulated gate structure (41') is formed over the upper surface (25') having a first gate conductor (38') laterally located at least partially between the spaced-apart source (32') and drain (27', 30') regions. In step 706, a second gate structure (61) is formed over the upper surface (25') having a second insulated gate conductor (68) laterally located at least partially between the spaced-apart source (32') and body contact (BC) (34') regions. In step 708, the second gate conductor (68) is electrically coupled to the body contact (BC) region (34'). LDMOS device 60 of FIG. 3 results. Method 700 then proceeds to END 710. Persons of skill in the art will understand that the body contact (BC) region (34') is of the first conductivity type and the source (32') and drain (27', 30') regions are of a second, opposite conductivity type. Persons of skill in the art will also understand that steps 704-708 may be performed in various orders and that the particular sequence listed is not intended to imply that other sequences are precluded. Further, various steps may be combined. For example and not intended to be limiting, the first insulated gate structure (41') and the second insulated gate structure (61) may be formed in either order or substantially simultaneously. In addition, a drain contract region (30') and the source region (32') may also be formed in either order or substantially simultaneously. Further variations of method 700 are discussed following the discussion of FIG. 8 along with variations of method 800.

Method 800 has several embodiments depending upon the particular structures chosen by the designer. For example and not intended to be limiting, in one embodiment, method 800 may comprise steps 802-818. Alternatively, in another embodiment, step 806 in which the equivalent of well region 28' would be formed, may be omitted. In a further embodiment, well region 26' may be provided, before during or after providing (drain) well region 27'.

Referring now to FIG. 7, method 800 begins with START 801 and initial step 802 wherein there is provided a substrate (22') having an upper SC region (24') with an upper surface (25'), the upper SC region (24') being of a first (e.g., P) conductivity type. In step 804, there is formed proximate the upper surface (25') a first (e.g., drain) SC region (27') of a second, opposite, (e.g., N) conductivity type, wherein a first part (24'-1) of the upper SC region (24') is separated from the first SC region (27') by a PN or NP junction (29').

In an exemplary embodiment, method 800 further proceeds by path 805-1 to step 808, and in another exemplary embodiment, method 800 further proceeds via path 805-2 to step 806 and via path 807 to step 808. Either arrangement is useful. In step 806, the doping of a second part (28') of the upper SC region (24') is locally increased proximate the upper surface (25'). In step 808 there is formed a drain contact (30) of the second conductivity type in the first (e.g., drain) SC region (27). In step 810 there is formed a source region (32') of the first conductivity type in the upper SC region (28', 24') separated from the PN or NP junction (29) by a first channel part (35') of the upper SC region (24', 28').

Referring now to FIG. 8, in step 812 there is formed a body contact region (34') of the first conductivity type in the upper SC region (24, 28'), laterally spaced apart from the source region (32') by a second channel part (37') of the upper SC region (24, 28'). In step 814, there is formed, a first insulated gate structure (41') having a first gate conductor (38') overlying the first channel part (35') of the upper SC region (24', 28') and extending laterally at least to the PN or NP junction (29). In step 816, there is formed a second insulating gate structure (61) having a second gate conductor (68) overlying the second channel part (37') of the upper SC region (24', 28'). In step 818, the second gate conductor (68) is electrically coupled to the body contact region (34'). It is preferable but not essential that such connection be made Ohmically without significant intervening impedance. But different connections may be made in other embodiments, wherein intervening elements may be provided so that the second gate conductor (68) and the body contact region (34') are electrically coupled rather than directly interconnected. Either arrangement is useful. Method 800 then proceeds to END 820. LDMOS device 60 of FIG. 3 results.

Persons of skill in the art will understand that steps 804-818 may be performed in various orders and that the particular sequence listed is not intended to imply that other sequences are precluded. Further, various steps may be combined. For example and not intended to be limiting, the first insulated gate structure (41') and the second insulated gate structure (61) may be formed in either order or substantially simultaneously. In addition, the drain contract region (30') and the source region (32') may also be formed in either order or substantially simultaneously. In a further embodiment it is desirable but not essential to form a third SC region (26') of the first conductivity type underlying the first (e.g., drain) SC region (27') of second conductivity type. In a still further embodiment, it is desirable to form an STI region (31'-1) proximate the upper surface (25') and laterally placed between the PN or NP junction (29) and the drain contact region (30'). In a preferred embodiment, the first (41') and second (61) gate structures may also be formed using substantially the same materials for gate conductors (38', 68) thereof and gate insulators (36', 66) thereof. By using the above-described manufacturing steps to form device 60 of FIG. 3, the above described benefits of improved SOA may be obtained in appropriate embodiments without adding any cost to the product, although additional processing steps are not precluded. This is a significant advantage of the above-described structure and method.

According to a first embodiment, there is provided a lateral-diffused-metal-oxide-semiconductor (LDMOS) device (60), comprising, a semiconductor (SC) region (24') having an upper surface (25'), spaced apart drain (27', 30'), source (32') and body contact (34') regions in the SC region (24'), a first insulated gate structure (41') having a first gate conductor (38') overlying a first portion of the upper surface (25') laterally located between the spaced apart drain (27', 30') and source (32') regions, and a second insulated gate structure (61) having a second gate conductor (68) overlying a second portion of the upper surface (25') laterally located between the spaced apart source (32') and body contact (34') regions, wherein the second gate conductor (68) is electrically coupled to the body contact region (34'). According to a further embodiment, the SC region (24') has a first conductivity type and the drain region (27', 30') has a second, opposite conductivity type. According to a still further embodiment, the source region (32') is of the second conductivity type and the body contact region (34') and the second portion of the upper surface (25') are of the first conductivity type. According to a yet further embodiment, the body contact region (34') is more heavily doped than the second portion of the upper surface (25). According to a still yet further embodiment, the spaced-apart source (32') and body contact (34') regions are located in the SC region (24') proximate the upper surface (25') thereof. According to a yet still further embodiment, the source region (32') and the body contact region (34') are laterally separated by at least about 0.1 micrometers. According to another embodiment, the first and second insulated gate structures (41', 61) comprise substantially the same materials for their gate conductors (38', 68) and their gate insulators (36', 66). According to a still another embodiment, the second insulated gate structure (61) is adapted when biased to electrically couple the source region (32') and the body contact region (34'). According to a yet another embodiment, the drain region (27', 30') comprises a drift space (27'-1) laterally proximate the first insulated gate structure (41') and a drain contact region (30'). According to a still yet another embodiment, the first (38') and second (68) gate conductors are of the same conductivity type.

According to a second embodiment, there is provided a method (700, 800) for forming a lateral-diffused-metal-oxide-semiconductor (LDMOS) device (60), comprising, providing a supporting semiconductor (SC) region (24') of a first conductivity type, having an upper surface (25'), forming spaced-apart drain (27'), source (32') and body contact (34') regions in the supporting SC region (24'), forming a first insulated gate structure (41') over the upper surface (25') having a first gate conductor (38') laterally located between the spaced-apart \source (32') and drain (27') regions, forming a second insulated gate structure (61) over the upper surface (25'), having a second gate conductor (68) laterally located between the spaced-apart source (32') and body contact (34') regions, and electrically coupling the second gate conductor (68) to the body contact region (34'). According to a further embodiment, the step of providing the supporting SC region (24') of the first conductivity type with an upper surface (25') and the step of forming a drain region (27'), further comprise forming proximate the upper surface (25') the drain region (27') of a second, opposite, conductivity type wherein a first part (24'-1) of the supporting SC region (24') of the first conductivity type is laterally adjacent to the drain region (27') proximate the upper surface (25') and forming a PN or NP junction (29') therewith. According to a still further embodiment, the method further comprises locally increasing the doping of a second part (28') of the supporting SC region (24') laterally spaced from the drain region (27') by the first part (24'-1) of the supporting SC region (24'). According to a yet further embodiment, the method further comprises, forming the source region (32') of the second conductivity type within the second part (28') of the supporting SC region (24'), spaced-apart from the NP or PN junction (29') by a first channel region (35'). According to a still yet further embodiment, the method further comprises, forming the body contact region (34') of the first conductivity type within the supporting SC region (24'), spaced-apart from the source region (32') by a second channel region (37'). According to a yet still further embodiment, the step of forming a second insulated gate structure (61) over the upper surface (25'), having a second gate conductor (68) laterally located between the spaced-apart source (32') and body contact (34') regions, comprises forming the second gate conductor (68) over a semiconductor region (28', 24') of the same conductivity type as the body contact region (34'). According to another embodiment, providing the first insulated gate structure (41') and providing the second insulated gate structure (61) are performed substantially at the same time using substantially the same materials.

According to a third embodiment, there is provided a semiconductor device (60), comprising, a semiconductor body (24') of a first conductivity type having an upper surface (25'), a drain region (27') and a source region (32') of a second, opposite conductivity type, laterally separated at the upper surface (25') by a first separation region (35'), a first insulated gate structure (41') overlying the first separation region (35'), adapted when biased to alter electrical conduction between the source region (32') and the drain region (27'), a body contact region (34') of the first conductivity type Ohmically coupled to the semiconductor body (24') and laterally separated from the source region (32') at the upper surface (25') by a second separation region (37'), and a second insulated gate structure (61) overlying the second separation region (37'), adapted when biased to alter electrical conduction between the source region (32') and the body contact region (34'). According to a further embodiment, the second insulated gate structure (61) has a gate conductor (68) overlying and insulated from the second separation region (37') by a gate insulator (66), and wherein the gate conductor (68) is electrically coupled to the body contact region (34'). According to a still further embodiment, the semiconductor device (60) further comprises a well region (28') of the first conductivity type in the semiconductor body (24'), extending to the upper surface (25') and having higher conductivity than the semiconductor body (24'), and in which the source region (32'), body contact region (34') and second separation region (37') are located.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A lateral-diffused-metal-oxide-semiconductor (LDMOS) device, comprising:
   a semiconductor (SC) region having an upper surface;
   spaced apart drain, source and body contact regions in the SC region;
   a first insulated gate structure having a first gate conductor overlying a first portion of the upper surface laterally located between the spaced apart drain and source regions; and
   a second insulated gate structure having a second gate conductor overlying a second portion of the upper surface laterally located between the spaced apart source and body contact regions, wherein the second gate conductor is electrically coupled to the body contact region.

2. The LDMOS device of claim 1, wherein the SC region has a first conductivity type and the drain region has a second, opposite conductivity type.

3. The LDMOS device of claim 2, wherein the source region is of the second conductivity type and the body contact region and the second portion of the upper surface are of the first conductivity type.

4. The LDMOS device of claim 3, wherein the body contact region is more heavily doped than the second portion of the upper surface.

5. The LDMOS device of claim 3, wherein the spaced-apart source and body contact regions are located in the SC region proximate the upper surface thereof.

6. The LDMOS device of claim 5, wherein the source region and the body contact region are laterally separated by at least about 0.1 micrometers.

7. The LDMOS device of claim 1, wherein the first and second insulated gate structures comprise substantially the same materials for their gate conductors and their gate insulators.

8. The LDMOS device of claim 1, wherein the second insulated gate structure is adapted when biased to electrically couple the source region and the body contact region.

9. The LDMOS device of claim 1, wherein the drain region comprises a drift space laterally proximate the first insulated gate structure and a drain contact region.

10. The LDMOS device of claim 1, wherein the first and second gate conductors are of the same conductivity type.

11. A method for forming a lateral-diffused-metal-oxide-semiconductor (LDMOS) device, comprising:
    providing a supporting semiconductor (SC) region of a first conductivity type, having an upper surface;
    forming spaced-apart drain, source and body contact regions in the supporting SC region;
    forming a first insulated gate structure over the upper surface having a first gate conductor laterally located between the spaced-apart\source and drain regions;
    forming a second insulated gate structure over the upper surface, having a second gate conductor laterally located between the spaced-apart source and body contact regions; and
    electrically coupling the second gate conductor to the body contact region.

12. The method of claim 11, wherein the step of providing the supporting SC region of the first conductivity type with an upper surface and the step of forming a drain region, further comprise forming proximate the upper surface the drain region of a second, opposite, conductivity type wherein a first part of the supporting SC region of the first conductivity type is laterally adjacent to the drain region proximate the upper surface and forming a PN or NP junction therewith.

13. The method of claim 12, further comprising, locally increasing the doping of a second part of the supporting SC region laterally spaced from the drain region by the first part of the supporting SC region.

14. The method of claim 13, further comprising, forming the source region of the second conductivity type within the second part of the supporting SC region, spaced-part from the NP or PN junction by a first channel region.

15. The method of claim 14, further comprising, forming the body contact region of the first conductivity type within the supporting SC region, spaced-apart from the source region by a second channel region.

16. The method of claim 11, wherein the step of forming a second insulated gate structure over the upper surface, having a second gate conductor laterally located between the spaced-apart source and body contact regions, comprises forming the second gate conductor over a semiconductor region of the same conductivity type as the body contact region.

17. The method of claim 11, wherein providing the first insulated gate structure and providing the second insulated gate structure are performed substantially at the same time using substantially the same materials.

18. A semiconductor device, comprising:
- a semiconductor body of a first conductivity type having an upper surface;
- a drain region and a source region of a second, opposite conductivity type, laterally separated at the upper surface by a first separation region;
- a first insulated gate structure overlying the first separation region, adapted when biased to alter electrical conduction between the source region and the drain region;
- a body contact region of the first conductivity type Ohmically coupled to the semiconductor body and laterally separated from the source region at the upper surface by a second separation region; and
- a second insulated gate structure overlying the second separation region, adapted when biased to alter electrical conduction between the source region and the body contact region.

19. The semiconductor device of claim 18, wherein the second insulated gate structure has a gate conductor overlying and insulated from the second separation region by a gate insulator, and wherein the gate conductor is electrically coupled to the body contact region.

20. The semiconductor device of claim 18, further comprising, a well region of the first conductivity type in the semiconductor body, extending to the upper surface and having higher conductivity than the semiconductor body, and in which the source region, body contact region and second separation region are located.

* * * * *